June 3, 1969 C. A. KOEHLER, JR., ET AL 3,448,345

INTERCONNECTION SYSTEM

Filed June 8, 1967 Sheet 1 of 4

June 3, 1969 C. A. KOEHLER, JR., ET AL 3,448,345

INTERCONNECTION SYSTEM

Filed June 8, 1967 Sheet 4 of 4

United States Patent Office 3,448,345

Patented June 3, 1969

3,448,345
INTERCONNECTION SYSTEM

Carl August Koehler, Jr., Santa Ana, Calif., and Mark Allen Shrock, Mechanicsburg, Pa., assignors to AMP Incorporated, Harrisburg, Pa.

Filed June 8, 1967, Ser. No. 645,575
Int. Cl. H02b *1/04, 9/00;* H05k *1/00*
U.S. Cl. 317—101 6 Claims

ABSTRACT OF THE DISCLOSURE

Electrical interconnection system for printed circuit boards and integrated circuit units comprises a plurality of rows of connectors mounted in alignment with each other on a panel board. Each connector comprises an insulating housing having a trough for reception of a board and having contact receiving cavities on each side of the trough. Contacts are mounted in these cavities and have first contact means which engage conductors on the printed circuit board and second contact means beside, and spaced from, the first contact means. Openings in the housing on each side of the trough communicate with second contact means whereby printed circuit board can be inserted into trough and leads from integrated circuit units can be inserted into openings to engage second contact means. Contact terminals have integral terminal posts extending through panel and beyond opposite side thereof to permit point-to-point interconnection wiring.

The circuit components mounted on printed circuit boards are commonly interconnected among a plurality of circuit boards by means of connectors having contact terminals therein. These connectors are mounted on mounting panels and the circuit boards mounted in the connectors. The contact terminals in the connectors are provided with posts which extend beyond the opposite side of the panel and interconnections between the numerous boards or the panel are made by point-to-point wiring techniques. Many different designs of connectors of this type are now in everyday use.

The advent of the integrated circuit unit has given rise to a need for additional interconnection wiring means for complicated circuitry. An integrated circuit comprises a small wafer-like block having a number of electrical leads (fourteen in one presently used type) extending therefrom. Such integrated circuit units can be mounted on printed circuit boards or can be mounted in special connectors but there are no interconnection systems available which are practical and efficient for both printed circuit boards and integrated circuit units. The present invention is directed to the provision of an interconnection wiring arrangement which is adaptable to both printed circuit boards and to integrated circuit units.

It is accordingly an object of the invention to provide an improved interconnection wiring arrangement. A further object is to provide an interconnection arrangement which can be used with printed circuit boards and with integrated circuit units. It is a further object to provide an electrical connector which will accept either a printed circuit board or an integrated circuit unit. It is a further object to provide an improved contact terminal which can be used with either a printed circuit board or an integrated circuit unit and which has integral means permitting point-to-point wiring between a multiplicity of similar terminals.

These and other objects of the invention are achieved in a preferred embodiment of an interconnection system comprising a mounting panel on which there are mounted a plurality of connector housings. Each housing has a trough-like recess on one side and a plurality of contact receiving cavities on each side of, and communicating with, the recess. Openings on each side of the recess communicate with the individual contact receiving cavities, these openings being spaced-apart by an amount equal to the spacing between the leads of an integrated circuit unit. The contacts mounted in the cavities each have a first contact means which is adapted to engage, and make electrical contact with, the conductors of a printed circuit board mounted in the trough-like recess, and a second contact means which is in the form of a resilient receptacle or arm adapted to make contact with a lead of an integrated circuit unit. The individual connectors are thus adapted to receive either an integrated circuit unit or a printed circuit board. The contacts additionally have terminal posts integral therewith which extend through the panel and beyond the opposite side thereof to permit electrical connections between the posts of different connectors by point-to-point wiring techniques. The invention thus permits the designer to specify either printed circuit boards or integrated circuit units, and any combination of printed circuit boards and integrated circuits in a given circuit arrangement and to achieve interconnections between the boards and integrated circuits by point-to-point wiring techniques.

Figures 3, 4, 5, 5A, 14, 15:
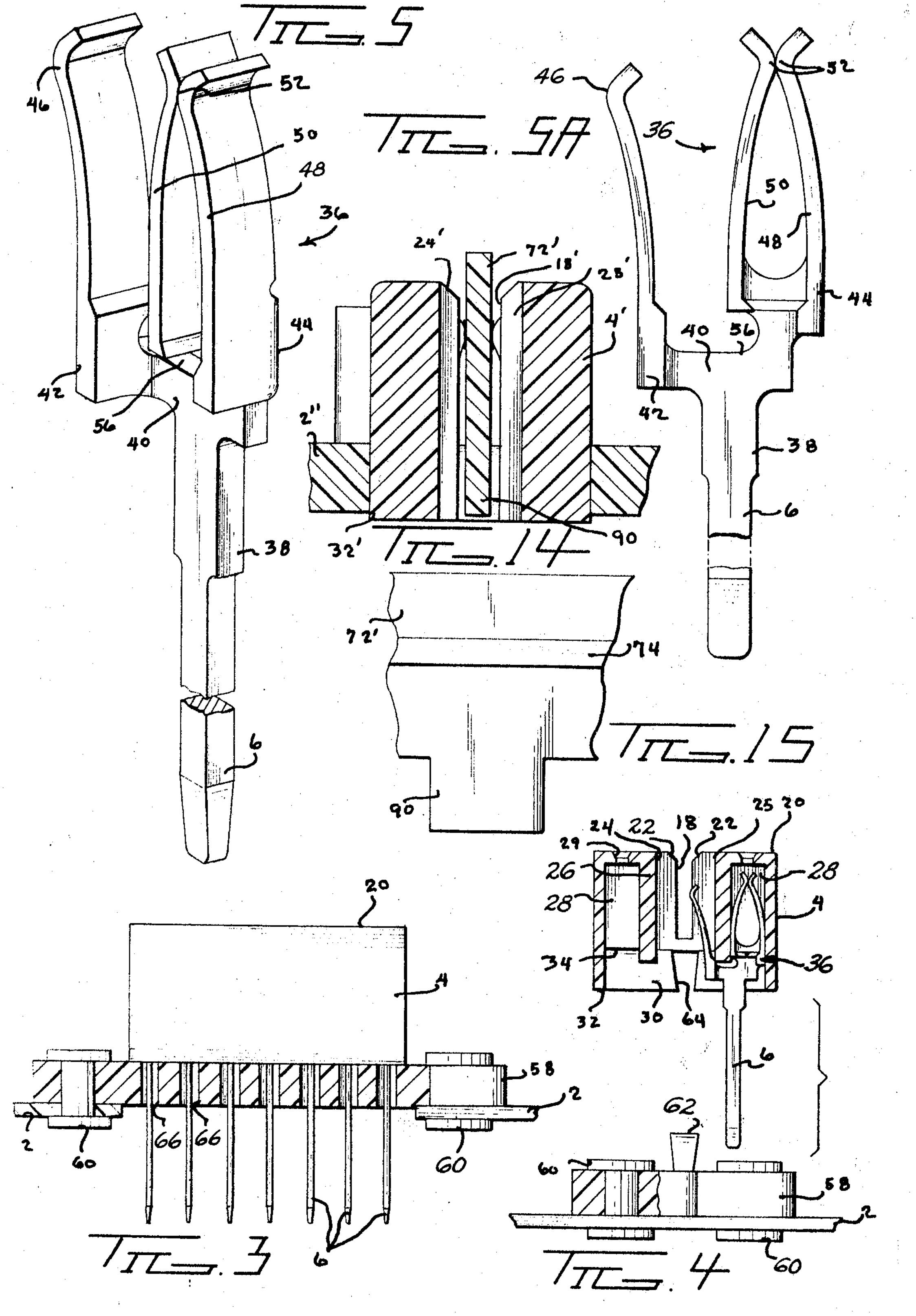
FIGURE 3 is a side view of a connector mounted on the mounting panel.
FIGURE 4 is an exploded sectional transverse view of the connector.
FIGURE 5 is a perspective view of a contact terminal in accordance with the invention.
FIGURE 5A is a front view of the terminal of FIGURE 5.
Figures 8, 9, 10, 11, 12, 13:
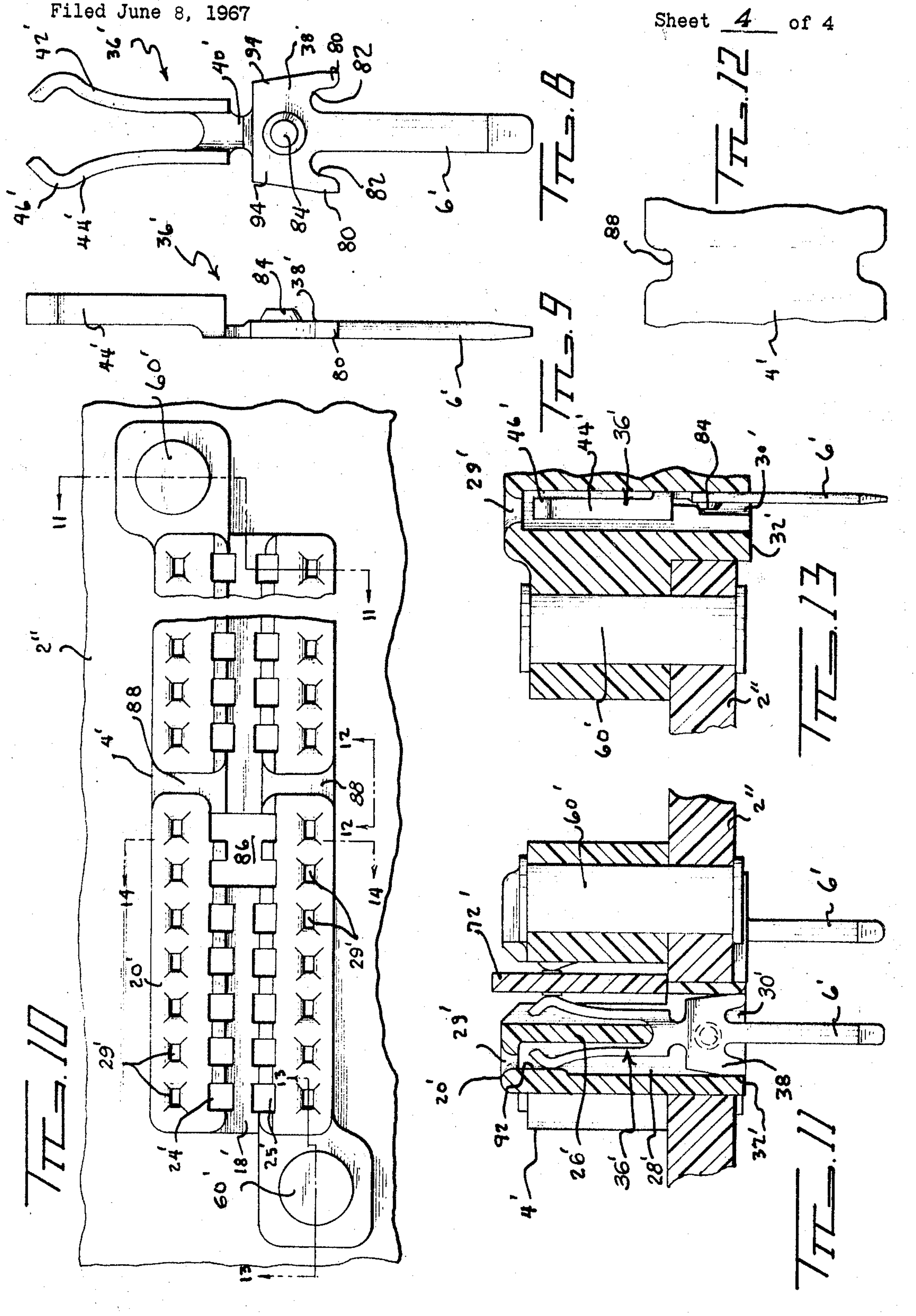
FIGURE 8 is a front view of an alternative form of contact terminal.
FIGURE 9 is a side view of the terminal of FIGURE 8.
FIGURE 10 is a plan view of an alternative form of housing which is adapted to accept a terminal of the type shown in FIGURES 8 and 9.

FIGURES 11, 12, 13, and 14 are views taken along the lines 11—11, 12—12, 13—13, and 14—14 of FIGURE 10; and FIGURE 15 is a fragmentary view of a bus bar adapted for use with the connector of FIGURE 10.

Figures 1, 6, 7:
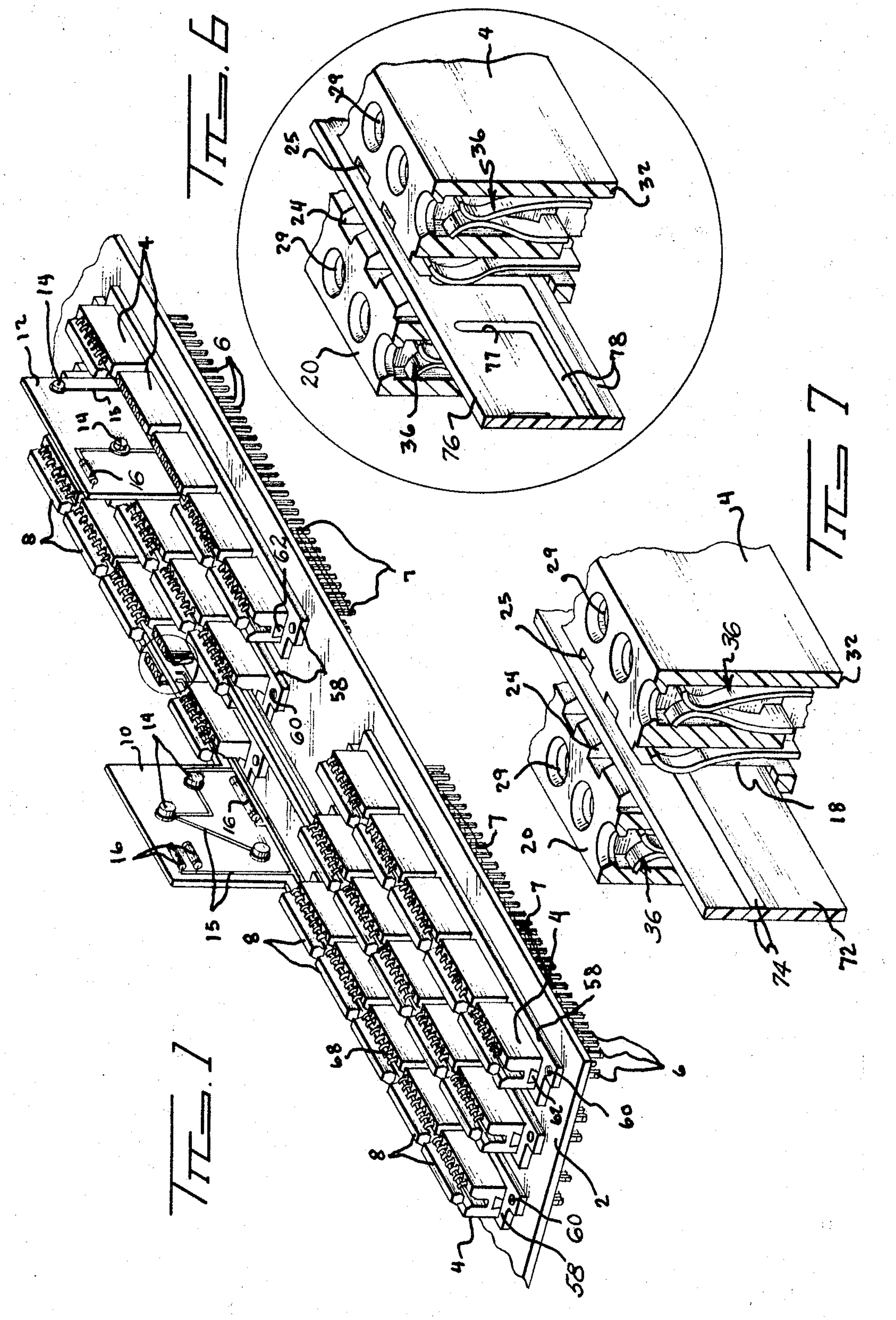
FIGURE 1 is a perspective fragmentary view of one embodiment of an interconnection system in accordance with the invention.
FIGURE 6 is an enlarged fragmentary view showing the circled portion of the system indicated in FIGURE 1.
FIGURE 7 is a view similar to FIGURE 6 but illustrating the use of a bus bar in a row of connectors.

The interconnection system shown in FIGURE 1 comprises a panel board 2 having a plurality of connector housings 4 mounted thereon in separate spaced-apart rows. Contact terminals mounted in the housings 4 and described below have integral terminal posts 6 which extend downwardly as viewed in FIGURE 1 and beyond the underside of the panel 2. These posts are used to make interconnections between the numerous printed circuit boards and integrated circuits in the system by point-to-point wiring techniques, for example, by wrap-type or clip-type connections.

In FIGURE 1, a plurality of integrated circuit units 8 each having fourteen electrical leads extending therefrom are mounted on some of the connectors 4 and printed circuit boards 10, 12 are mounted in other connectors.

The boards 10, 12 have electrical components thereon such as transistors 14 and resistors 16. Printed conductors 15 in the surfaces of the boards 10, 12 extend between the components 14, 16 and connect them to each other. Some of the conductors on the board 12 extend downwardly as viewed in FIGURE 1 to the lower edge of the board and are contacted by terminals in the housing 4 in which board 12 is mounted. The board 10 differs from the board 12 in that it has laterally extending arms or bus bars 76 which will be described in further detail below.

Figure 2:
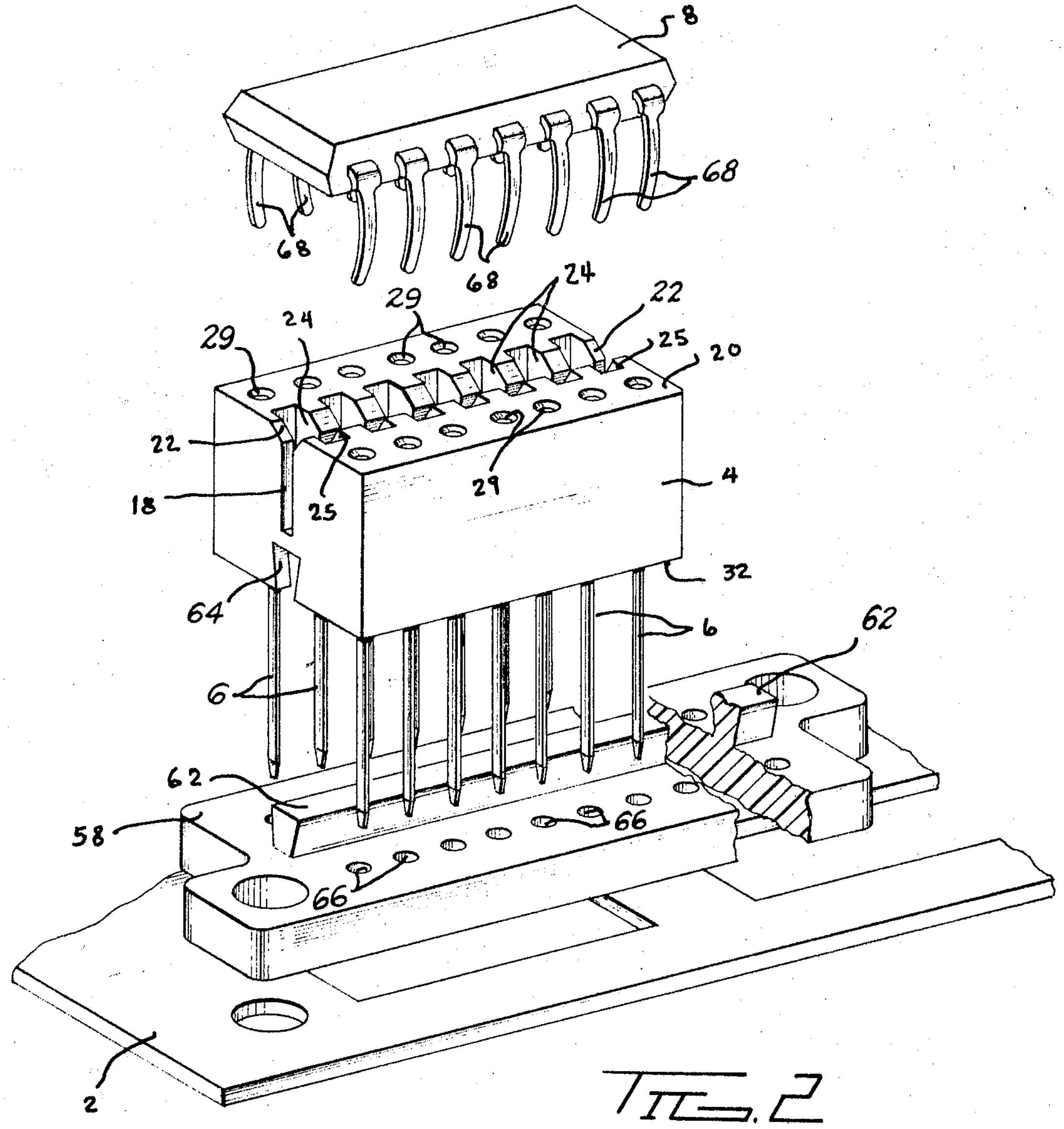
FIGURE 2 is an enlarged exploded view showing a portion of the mounting panel, a connector in accordance with the invention, and an integrated circuit unit positioned for insertion into the connector.

Referring now to FIGURES 2–4, each of the individual connectors 4 comprises a housing of suitable insulating material such as nylon or diallyl phthalate having a trough-like recess 18 extending between its ends and inwardly from its upper side 20. The sides of this recess are bevelled as shown at 22 to guide the edge portion of a printed circuit board into the recess during insertion. A plurality of contact receiving cavities 24 are provided in the block on each side of the recess, each cavity having an adjacent portion 25 which communicates directly with the recess 18 and which is separated from an inner cavity portion 28 by means of an integral barrier or wall 26. Openings 29 are provided in the upper surface 20 of the housing on each side of the recess 18 and communicate with the inner cavity portions 28. These openings accommodate the leads of the integrated circuits units as will be described below. The cavity portions 25, 28 merge in the lower portion of the connector housing in a common area 30 which opens onto the underside 32 of the housing. A downwardly facing shoulder 34 is provided adjacent to the lower end of the cavity portion 28 for retaining the contact terminals 36 in the housing.

Referring to FIGURES 5 and 5A, the individual contact terminals 36 each have a post portion 6 which is enlarged at its upper end 38 and which merges with a transversely extending yoke section 40. A first contact means 42 in the form of a resilient arm is integral with, and extends from, one side of the yoke 40 and a second contact means 44 is provided on the opposite side. The first contact means comprises an arm which may have an upper end 42 which is formed to provide a contact surface for engagement with an integrated circuit unit as described below. This second contact means comprises a pair of resilient arms extending from a common web and bent inwardly towards each other as shown at 48 and 50 so that they engage each other in a contact area adjacent to their upper ends 52. The contact arm 50 is formed from material adjacent to the yoke portion 40 so that a shoulder 56 is defined on the upper side of this yoke which is adapted to bear against the previously identified shoulder 34 in the housing.

In the disclosed embodiment, the individual connectors 4 are mounted on the panel by means of mounting blocks 58, which are also of insulating material and which are positioned above suitable openings in the panel as shown in FIGURE 2. These mounting blocks are secured to the panel by fasteners 60 and each block has an elongated wedge shaped projection 62 on its upper surface which is adapted to enter a similarly shaped notch 64 on the underside of the connector housing 4 thereby to lock the housing to the panel. Openings 66 are provided in the mounting blocks on each side of the projection or rib 62 for the accommodation of the terminal posts 6 which, when the connectors are mounted on the panel, will project downwardly beneath the surface of the panel 2 as shown in FIGURE 1.

The integrated circuit units 8 of the type shown in the drawing have seven individual leads 68 on each side, these leads being relatively stiff so that when the circuit unit shown in FIGURE 2 is moved downwardly relative to the connector 4, the leads will enter between the arms of contact means 44 in the contact area 52 of the contact terminals 36. In FIGURE 1, most of the connectors shown have integrated circuit units mounted thereon rather than printed circuit cards. The terminal posts 6 are interconnected by point-to-point wiring as indicated at 7.

The printed circuit card 12 is of the conventional type in that it has conductors 15 on its surfaces extending to its lower edge as viewed in FIGURE 1. This card has a width equal to the length of two individual connectors 4 and is received in the slots of two adjacent connectors as shown in FIGURE 1. The printed circuit conductors on the surface of the card 12 are in engagement with the first contact portions 42 of the contact terminals in the connectors.

The printed circuit card 10 has laterally extending arms or integral bus bars 76 at its lower end which are received in the slots of adjacent connectors. The conductors 15 on the card 10 have extensions 78 which reach outwardly along the arms 76. These extensions 78 have laterally directed branches 77 at specific locations to electrically contact predetermined contact terminals in the connectors. It will be noted that in FIGURE 1, a gap is provided in the back row of connectors for the accommodation of the printed circuit board 10. Such gaps are optional but may be desirable to improve accessibility.

FIGURE 7 shows the manner in which the central recesses 18 of the connectors can be used to accommodate a bus bar 72 having a printed circuit conductor 74 thereon. A similar conductor 74 would be provided on the opposite side of the bus bar for engagement with the contact terminals on the other side of the trough-like recesses of the connector. The conductor 74 can be as shown so that it contacts the first contact arm of every contact terminal or it can be similar to the contacts 78 of the integral bus bar 76, that is, it can extend along the lower edge of the bus bar and have an upwardly extending arm adapted to contact only selected contact terminals. The conductors on the bus bars can advantageously be used to provide a power supply for all of the boards or integrated circuit units in a given row of the system.

FIGURES 8–15 show an alternative embodiment of the invention which avoids the need for the mounting blocks 58 and in which an alternative form of contact terminal is used. In FIGURES 8–15, the reference numerals used are the same (but differentiated by prime marks) as those used in the description of the embodiment of FIGURES 1–7.

The contact terminals 36′ (FIGURES 8 and 9) have a post portion 6′ which merges with an enlarged rectangular mounting section 38′ intermediate the ends of the terminal. Slots 82 extend into this intermediate mounting portion on each side of the post to render the edge portions 80 slightly flexible thereby to assist in retaining the contacts in the housings. The sides of this intermediate mounting portion 38′ are tapered inwardly at their upper ends as shown at 94 to facilitate the insertion of the terminals into the cavities. A dimple 84 is provided on one face of the intermediate mounting portion 38′ for engagement with a bearing surface in the housing as will be described below.

A relatively narrow neck 40′ extends from the upper side of the intermediate mounting portions 38′ and a pair of side-by-side contact arms 42′, 44′ extend upwardly from this neck portion. The arm 44′ is outwardly curved at its upper end as viewed in FIGURE 11 and normally bears against a bearing surface 92 in the previously identified cavity portion 28′. The bearing surface 92 is in alignment with an opening 29′ on the upper side 20′ of the housing 4′ so that when a lead of an integrated circuit unit is inserted through the opening, the contact portion of the arm 44′ will engage the lead and press it against the bearing surface 92. The upper portion of the arm 42′ is similarly outwardly curved at 46′ for engagement with a conductor 15 on a printed circuit board or on a bus bar as previously described with reference to the embodiment of FIGURES 1–7.

The housing 4′ of the embodiment of FIGURES 8–14 differs from the housing 4 in that it is of a thickness such that it extends entirely through the opening in the panel 6 so that its lower side 32' is disposed beneath the underside of the panel as viewed in FIGURE 11. The housing is locked in position and mounted on the panel by means of fasteners 60' extending through ears or flanges on each end of the housing.

The contact terminals are retained in the housing cavities by means of the bosses 84 which bear against bearing surfaces in the cavities, portions 30' as shown, in FIGURE 13. The lower portions of the cavities as viewed in FIGURE 11 have a width which is slightly less than the width of the enlarged retention section 38' of the terminals so that upon insertion, an interference fit is obtained between this enlarged section of the terminal and the lower portions of the cavities. As previously noted, the lower corner portion 80 of these intermediate retention sections of the contacts are slightly flexed during insertion of the contacts to lock the contacts in the housing.

The upper side 20' of the housing may be provided with one or more transverse slots 88 which divide the housing into two or more sections, each of which is adapted to receive one integrated circuit unit. These slots thus function to locate the proper positions for the integrated circuits when they are being inserted into a connector by a technician. In FIGURE 10, an opening 86 is provided in the housing which extends entirely through from the upper side 20' to the underside 32'. This opening is adapted to receive a keying tooth 90 on a bus bar 72' (see FIGURE 15) thereby to precisely locate the bus bar in the system and to prevent axial movement of the bus bar with respect to the connector housing in which it is mounted. A printed circuit board can also be provided with a similar keying tooth to precisely locate it with reference to a given connector or series of connectors in an interconnection system.

An overall advantage of the disclosed interconnection system is that the circuit designer is afforded a high degree of versatility with regard to the types of components or integrated circuits he can use. He need only specify one type of connector block and one type of contact for any desired combination of printed circuit boards or integrated circuits. It is frequently necessary to use a number of individual circuit units such as transistors, resistors, potentiometers, and so forth in combination with an electrical system which is comprised for the most part of integrated circuit units. For example, in any system which a large number of integrated circuits are used, the power supply system would, of necessity, be mounted on a printed circuit board. It is also necessary in the case of tuned circuits to use components which must be mounted on printed circuit boards.

Changes in construction will occur to those skilled in the art and various apparently different modifications and embodiments may be made without departing from the scope of the invention. The matter set forth in the foregoing description and accompanying drawings is offered by way of illustration only. The actual scope of the invention is intended to be defined in the following claims when viewed in their proper perspective against the prior art.

What is claimed is:

1. An electrical interconnection system adapted to accept, and make interconnections among, printed circuit cards and integrated circuit units, said system comprising.

a supporting panel, a plurality of connectors mounted on one surface of said panel, each connector having a trough-like recess on one face thereof and having a plurality of contact-receiving cavities on each side of, and opening into, said recess, each connector further having a plurality of openings on said one face on each side of said recess, each opening communicating with one of said cavities, contact terminals on each side of said recess and in said cavities, each terminal having first contact means for contacting a conductor on one side of a card-like member in said recess and having second contact means adapted to contact a lead extending through the associated one of said openings, and means for making interconnections among said contact terminals whereby, integrated circuit units and card-like members can be interconnected by insertion of the leads of said integrated circuit units into said openings of some of said connectors and by insertion of said card-like members into the recesses of other ones of said conectors.

2. A system as set forth in claim 1 wherein said means for making interconnections among said terminals comprises posts integral with said contact terminals, said posts extending beyond the opposite surface of said panel and being adapted for point-to-point wiring techniques.

3. A system as set forth in claim 1 wherein said connectors are mounted on said panel in a row with said recesses in alignment, a bus bar extending in the recesses of at least two of said connectors, said bus bar having conductor means thereon in engagement with the said first contact means of said terminals to provide interconnections among said terminals.

4. A system as set forth in claim 1 wherein each of said contact terminals has a pair of contact arms comprising said first and second contact means, each of said terminals having an integral post portion extending beyond the opposite surface of said panel and constituting said means for making interconnections among said contact terminals.

5. An electrical connector housing comprising, a block of insulating material having an elongaged trough-like slot on one side thereon, a plurality of contact-receiving cavities in said block on each side of said slot, and openings on said one side on each side of said slot, each of said openings communicating with one of said cavities, said slot being adapted to receive a panel-like member having conductors on its surface, said openings being adapted to receive conductors extending from a circuit device, each of said cavities being adapted to receive a contact terminal, each of said terminals having first contact means adapted to engage a conductor on one side of an inserted panel-like member and having a second contact means adapted to engage a conductor inserted through one of said openings.

6. A device as set forth in claim 5 wherein each of said cavities has a first portion opening into, and communicating with, said slot, and a remote portion beneath said opening.

References Cited

UNITED STATES PATENTS

| | | | |
|---|---|---|---|
| 3,299,392 | 1/1967 | Evans. | |
| 3,311,790 | 3/1967 | Vizzier, et al. | 339—17 XR |
| 3,325,766 | 6/1967 | Kulb et al. | 339—17 XR |
| 3,325,771 | 6/1967 | Ruehlemann et al. | 339—17 XR |

LEWIS H. MYERS, *Primary Examiner.*

J. R. SCOTT, *Assistant Examiner.*

U.S. Cl. X.R.

339—17